United States Patent [19]
Eto

[11] Patent Number: 5,982,701
[45] Date of Patent: Nov. 9, 1999

[54] SEMICONDUCTOR MEMORY DEVICE WITH REDUCED INTER-BAND TUNNEL CURRENT

[75] Inventor: Satoshi Eto, Kawasaki, Japan

[73] Assignee: Fujitsu Limited, Kanagawa, Japan

[21] Appl. No.: 08/822,981

[22] Filed: Mar. 21, 1997

[30] Foreign Application Priority Data

Oct. 8, 1996 [JP] Japan .................................. 8-267277

[51] Int. Cl.⁶ .................................................. G11C 8/00
[52] U.S. Cl. ................................. 365/230.06; 365/189.09
[58] Field of Search ........................ 365/230.06, 230.03, 365/189.09, 189.11

[56] References Cited

U.S. PATENT DOCUMENTS

| | | | |
|---|---|---|---|
| 5,373,479 | 12/1994 | Noda | 365/230.06 |
| 5,467,316 | 11/1995 | Kim | 365/230.06 |
| 5,519,665 | 5/1996 | Chishiki | 365/230.06 |
| 5,640,359 | 6/1997 | Suzuki | 365/230.06 |

*Primary Examiner*—Son Mai
*Attorney, Agent, or Firm*—Nikaido Marmelstein Murray & Oram LLP

[57] ABSTRACT

A semiconductor memory device includes word drivers for selectively activating word lines with respect to memory cells. The semiconductor memory device further includes a control unit for controlling a gate voltage of transistors in the word drivers so as to reduce inter-band tunnel currents of the transistors.

17 Claims, 9 Drawing Sheets

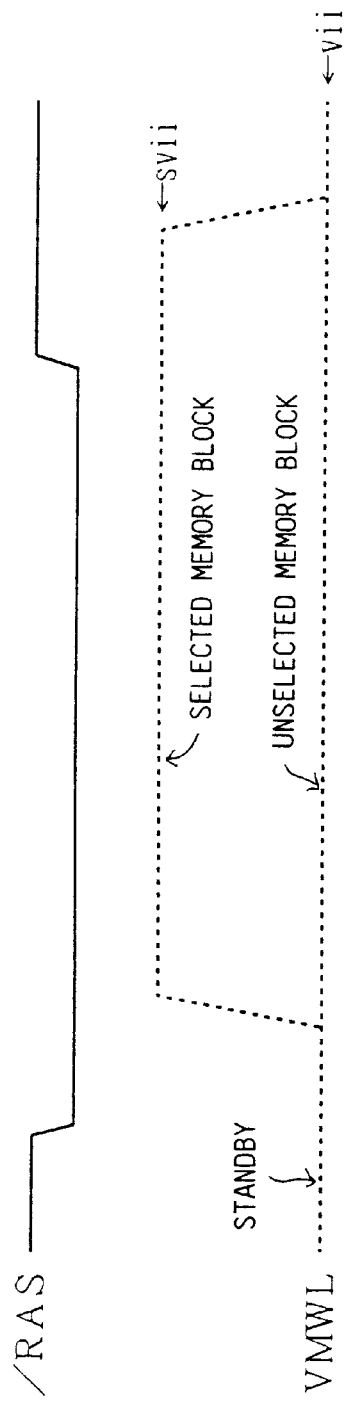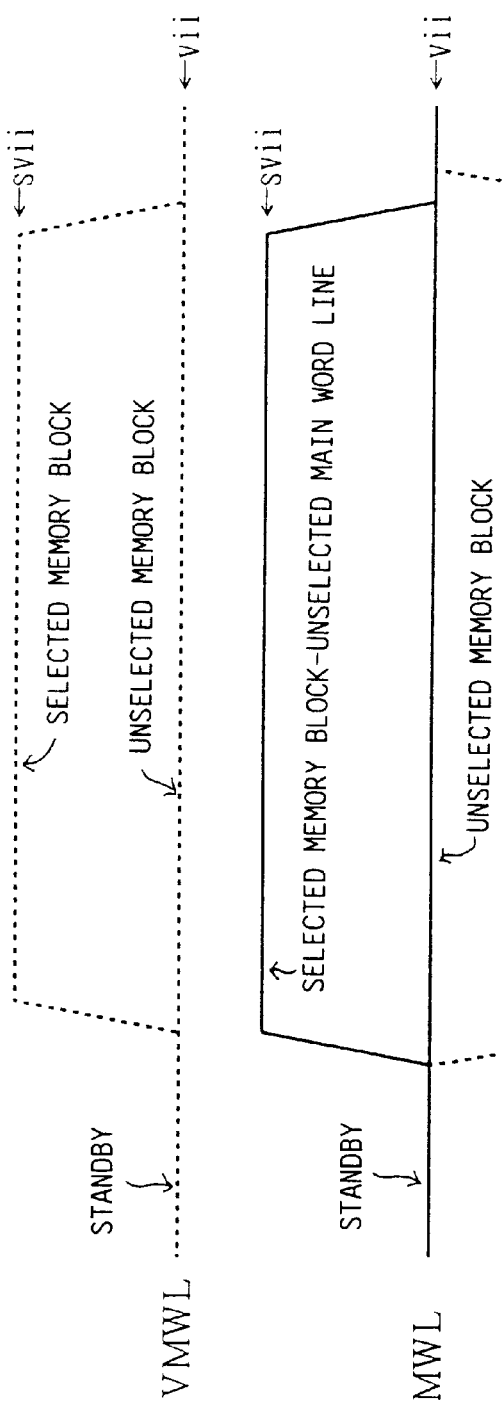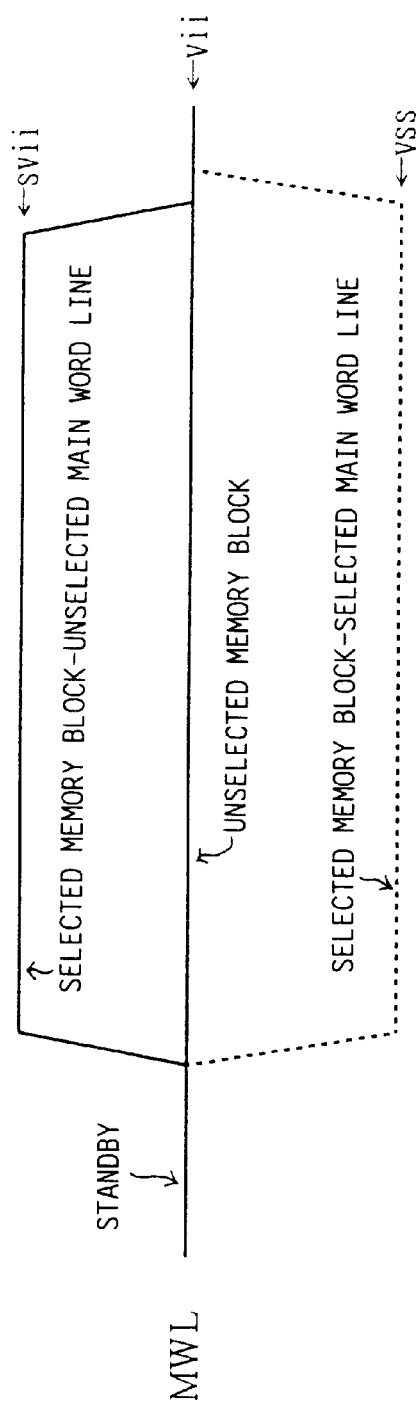

SEMICONDUCTOR MEMORY DEVICE WITH REDUCED INTER-BAND TUNNEL CURRENT

BACKGROUND OF THE INVENTION

1. Field of the Invention

The present invention generally relates to semiconductor memory devices, and particularly relates to a reduction of power consumption in a semiconductor memory device in a standby condition.

2. Description of the Prior Art

In order to shrink a size of transistors to step up an integration density of semiconductor memory devices such as DRAM, SRAM, flash memories, EPROM, etc., a concentration of impurities doped in the transistors needs to be increased. An increase in the impurity concentration narrows a width of depletion layers in the transistors, resulting in a larger electric field applied to the depletion layer. As a result, an inter-band tunnel current is generated, which is especially prominent in PMOS transistors. The inter-band tunnel current is caused by a large degree of bending of the band at the depletion layer, and flows even when a high voltage is applied to the gate of a PMOS transistor to turn it off.

FIG. 1 is an illustrative drawing for explaining an effect of the inter-band tunnel current. FIG. 1 shows an inverter circuit which is often used in word drivers for driving word-selection lines in a semiconductor memory device. The inverter circuit of FIG. 1 includes a PMOS transistor 201 and an NMOS transistor 202. In word drivers or the like in a semiconductor memory device, a high voltage ($V_{DD}$) is applied to a gate G1 of the PMOS transistor 201 and a gate G2 of the NMOS transistor 202 when the semiconductor memory device is in a standby condition waiting for data input/output. This high voltage turns the PMOS transistor 201 off and turns the NMOS transistor 202 on, thereby turning an output of the inverter circuit into a low voltage.

With an intensified electric field applied to the depletion layer because of an increased integration density of the semiconductor memory device, however, an inter-band tunnel current $I_{BT}$ is generated in the PMOS transistor 201 of FIG. 1. The inter-band tunnel current $I_{BT}$ flows from a bulk B to a drain D in the PMOS transistor 201. As long as it remains a small amount of current, the inter-band tunnel current does not cause any detrimental effect to circuit operations.

In a semiconductor memory device, the inverter circuits as shown in FIG. 1 are used at various points across the chip. Word drivers for driving word-selection lines, in particular, include the inverter circuits of FIG. 1 for each of the word lines to which a high voltage is applied, so that the number of the inverter circuits is large, and the inter-band tunnel current flows in a large amount in each of these inverter circuits. Because of this, the inter-band tunnel current $I_{BT}$ in all the inverter circuits of the word drivers becomes significant in its total amount when the semiconductor device is in the standby condition.

Even when the semiconductor memory device is in operation for reading data, the inverter circuits of the word drivers are in a condition for outputting a low voltage level in unselected memory blocks. The inter-band tunnel current $I_{BT}$ in these inverter circuits are also significant in its total amount.

Power consumption caused by the inter-band tunnel currents is not preferable, especially when the semiconductor memory device is mounted in portable equipment, because it adds to the consumption of a battery. Portable equipment usually need a semiconductor memory device with low power consumption in order to make an efficient use of limited battery power.

Accordingly, the inter-band tunnel current should be reduced in a semiconductor memory device in order to suppress an amount of consumed current during the standby-condition period. It is known that the inter-band tunnel current is prominent generally in a turned-off transistor with a high voltage applied between a bulk and either a source or a drain. A reduction in the voltage between the bulk and either the source or the drain should thus result in a suppression of the inter-band tunnel current. Alternately, a change in the gate voltage to bring the transistor closer to a turned-on condition should decrease the inter-band tunnel current.

Accordingly, there is a need for a semiconductor memory device which can suppress an inter-band tunnel current in word drivers for driving word-selection lines so as to reduce a consumed current during the standby-condition period.

SUMMARY OF THE INVENTION

Accordingly, it is a general object of the present invention to provide a semiconductor memory device which can satisfy the need described above.

It is another and more specific object of the present invention to provide a semiconductor memory device which can suppress an inter-band tunnel current in word drivers for driving word-selection lines so as to reduce a consumed current during the standby-condition period.

In order to achieve the above objects according to the present invention, a semiconductor memory device includes word drivers for selectively activating word lines with respect to memory cells, and a control unit for controlling a gate voltage of transistors in the word drivers so as to reduce inter-band tunnel currents of the transistors.

In the semiconductor memory device described above, the control unit is provided in order to control the gate voltage of the transistors in the word drivers, so that the inter-band tunnel currents of the transistors can be controlled and reduced. By effecting this reduction in a standby condition, current consumption during the standby-condition period can be suppressed.

According to one embodiment of the present invention, the word drivers are grouped into a plurality of groups, and the control unit separately controls each of the groups. Because of this, appropriate control can be individually introduced to each of the groups.

According to another embodiment of the present invention, a plurality of memory blocks, which are comprised of the memory cells, are provided, and the control unit separately controls each of the memory blocks. This makes it possible that the inter-band tunnel currents are controlled with respect to each memory block.

According to an embodiment of the present invention, the control unit controls the memory blocks differently between selected memory blocks selected for data input/output and unselected memory blocks other than the selected memory blocks, and the inter-band tunnel currents are reduced with respect to the unselected memory blocks. Excessive power consumption is thus reduced even when the semiconductor memory device is performing an operation for data input/output.

Other objects and further features of the present invention will be apparent from the following detailed description when read in conjunction with the accompanying drawings.

BRIEF DESCRIPTION OF THE DRAWINGS

FIGS. 8A through 8C are timing charts showing a main-word-decoder driving voltage from the main-word-decoder driving circuit and the voltage of the main word line from the main word decoder.

DESCRIPTION OF THE PREFERRED EMBODIMENTS

In the following, embodiments of the present invention will be described with reference to the accompanying drawings.

Figure 2:
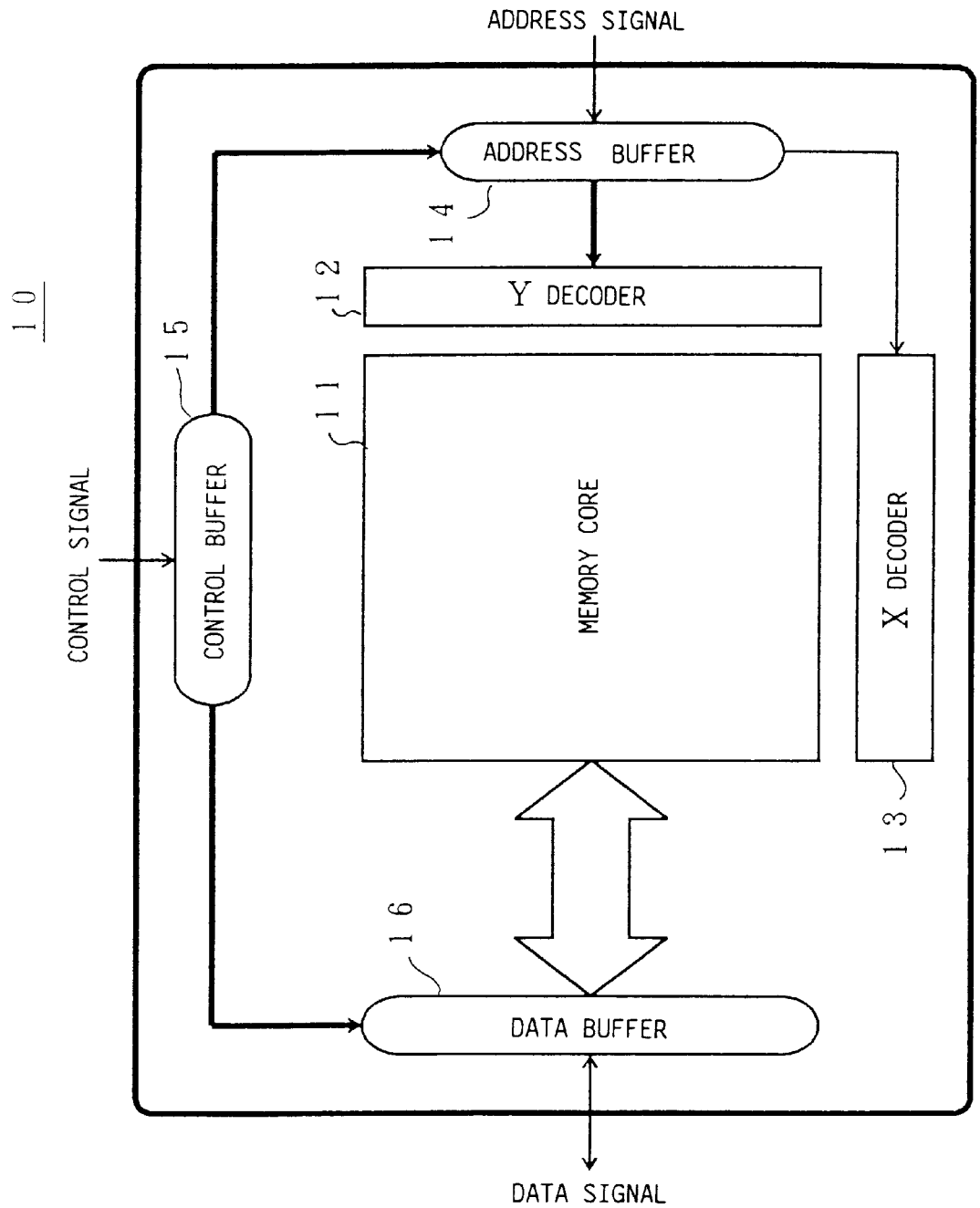
FIG. 2 is a block diagram of a schematic configuration of a DRAM to which the present invention is applied.

FIG. 2 is a block diagram of a schematic configuration of a DRAM to which the present invention is applied. In the following, embodiments of the present invention will be described by taking a DRAM as an example. It should be noted, however, that the present invention is applicable to other types of semiconductor memory devices such as flash memories, EPROM, etc.

A DRAM 10 of FIG. 2 includes a memory core 11, a Y decoder (column decoder) 12, an X decoder (row decoder) 13, an address buffer 14, a control buffer 15, and a data buffer 16. The memory core 11 is comprised of an array of memory cells each storing one-bit information, word-selection lines, column-selection lines, etc.

An address signal supplied to the address buffer 14 is fed to the X decoder 13 and the Y decoder 12, where the address signal is decoded. According to a result of the address decoding, the Y decoder 12 selectively activates the column-selection lines, and the X decoder 13 selectively activates the word-selection lines. In the case of a data-read operation, information is read from the memory core 11 with respect to the memory cells corresponding to the activated column and the activated word, and is output as a data signal via the data buffer 16. In the case of a data-write operation, a data signal externally provided is supplied to the memory core 11 via the data buffer 16, with the data written into memory cells corresponding to the activated column and the activated word.

The control buffer 15 controls the address buffer 14 and the data buffer 16 based on control signals externally provided. The control signal includes a RAS (row address strobe) signal, a CAS (column address strobe) signal, etc.

Figure 3:
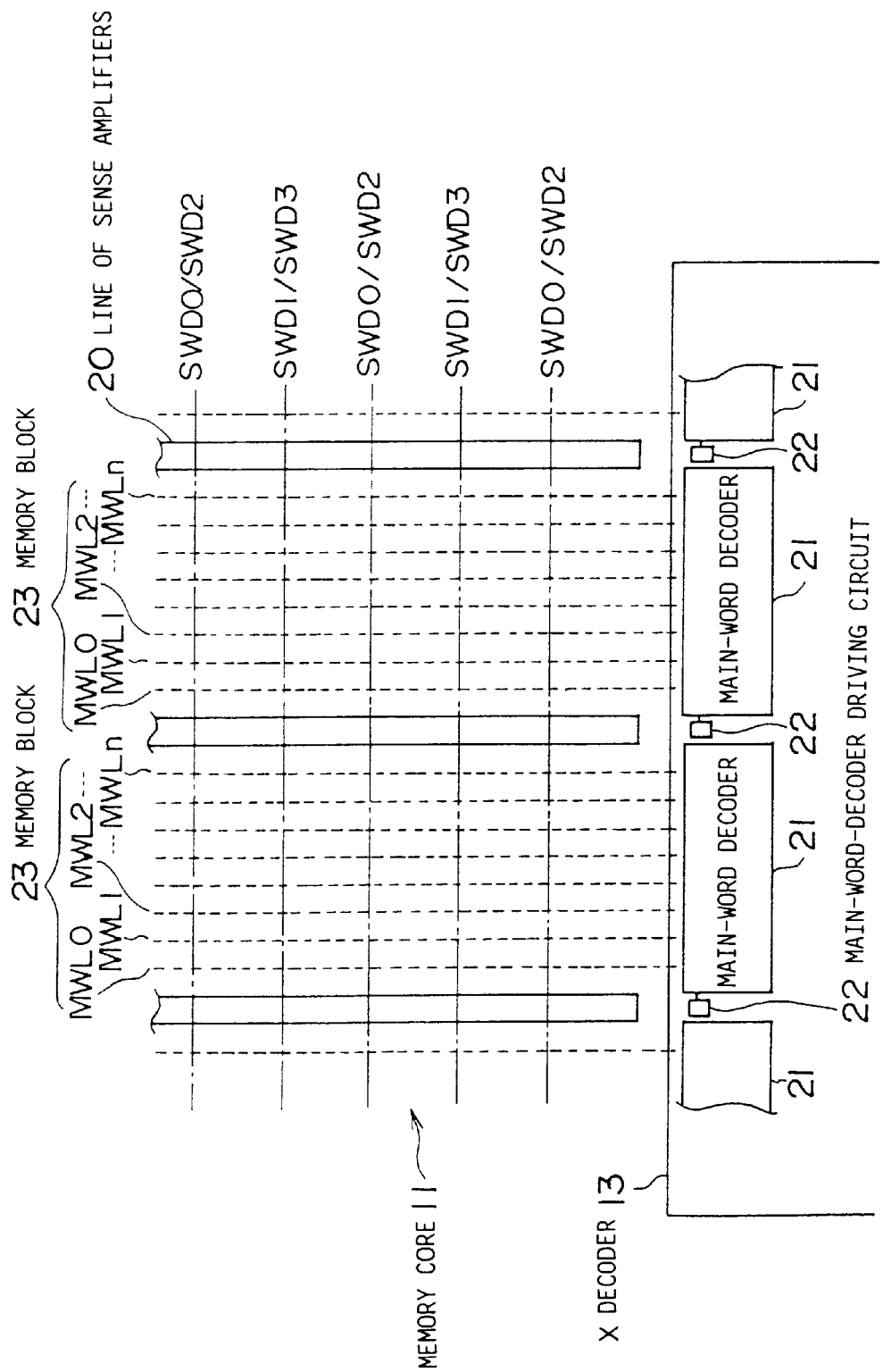
FIG. 3 is an illustrative drawing showing portions relating to the X decoder of the DRAM shown in FIG. 2.

FIG. 3 is an illustrative drawing showing portions relating to the X decoder 13 of the DRAM 10 shown in FIG. 2. As shown in FIG. 3, the X decoder 13 includes a plurality of main word decoders 21 and main-word-decoder driving circuits 22 for supplying power to the main word decoders 21. Each of the main word decoders 21 is provided with main word lines MWL0 through MWLn, a total of n lines, extending towards the inside of the memory core 11. Sub-word decode lines SWD0 through SWD3 are laid out in perpendicular to the main word lines MWL0 through MWLn. The sub-word decode lines SWD0 through SWD3 constitute part of signal lines used for word decoding, and transfer signals supplied from the X decoder 13.

The memory core 11 is divided into a plurality of memory blocks 23 between lines of sense-amplifiers 20, which amplify signals on bit lines (not shown) connected to the memory cells. One of the memory blocks 23 is selected, and one of the main word lines MWL0 through MWLn is selected in the selected memory block 23. Further, one of the sub-word decode lines SWD0 through SWD3 is selected to choose a single word line (sub-word line), thereby making a selection of word lines with regard to the memory cells. The main word decoders 21 and the main-word-decoder driving circuits 22 are provided one each with respect to each of the memory blocks 23, effecting different control for each block.

Figure 4A:
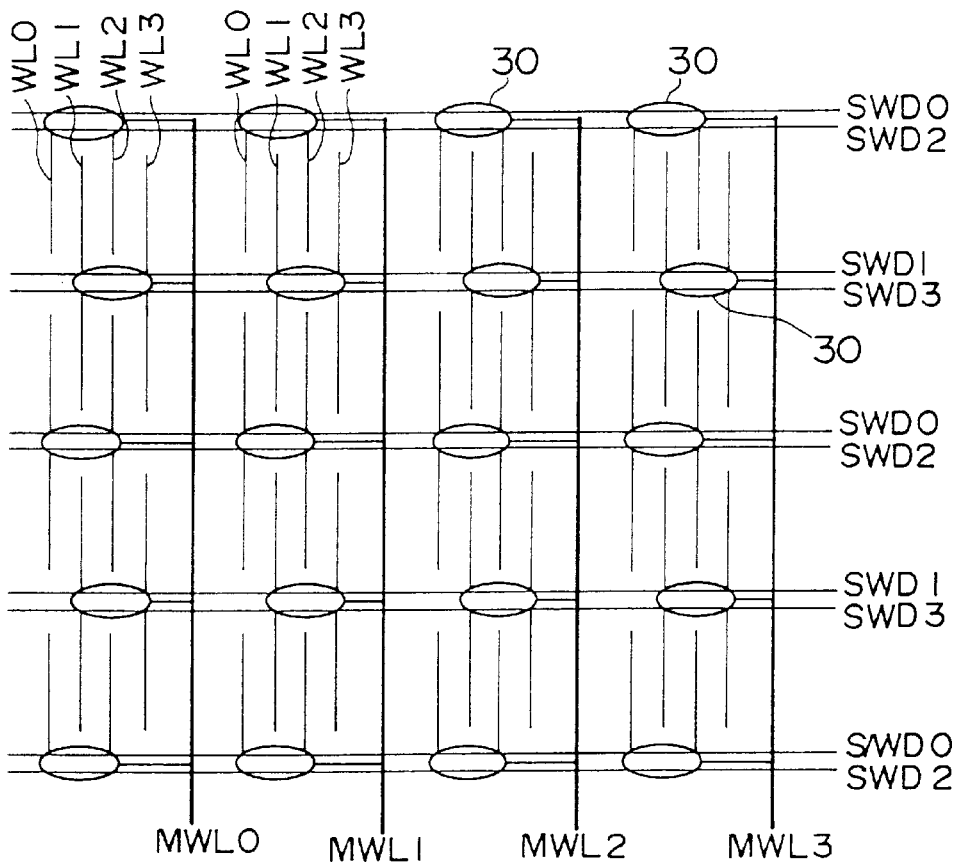
FIGS. 4A and 4B are illustrative drawings showing relations between main word lines MWL0 through MWLn and sub-word decode lines SWD0 through SWD3 shown in FIG. 3.
Figure 4B:
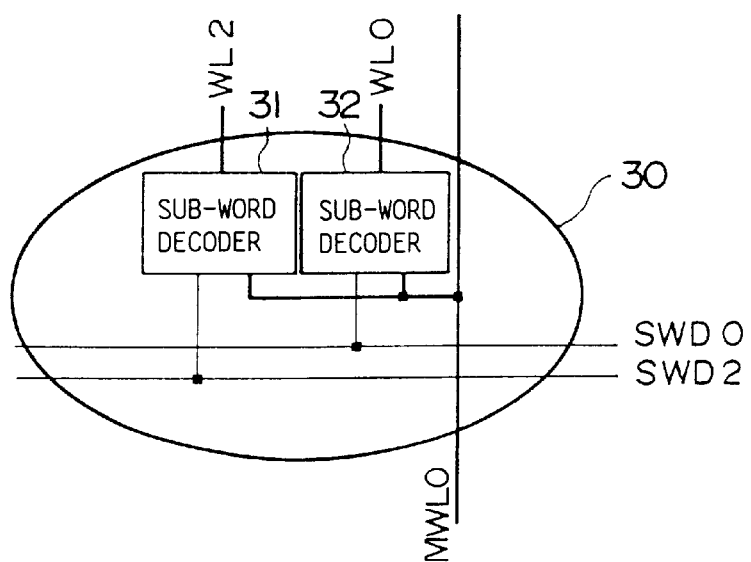

FIGS. 4A and 4B are illustrative drawings showing relations between the main word lines MWL0 through MWLn and the sub-word decode lines SWD0 through SWD3. FIG. 4A shows only four (MWL0 through MWL3) of the main word lines MWL0 through MWLn. As shown in FIG. 4A, one of the main word lines MWL0 through MWL3 and either the pair of the sub-word decode lines SWD0 and SWD2 or the pair of the sub-word decode lines SWD1 and SWD3 are supplied to each sub-word decoding unit 30.

FIG. 4B shows the sub-word decoding unit 30 which receives the main word line MWL0 and the sub-word decode lines SWD0 and SWD2. The sub-word decoding unit 30 of FIG. 4B includes sub-word decoders 31 and 32. The sub-word decoder 31 receives the main word line MWL0 and the sub-word decode line SWD2, and turns a sub-word line WL2 into a high voltage when both of these two lines are selected. The sub-word decoder 32 receives the main word line MWL0 and the sub-word decode line SWD0, and turns a sub-word line WL0 into a high voltage when both of these two lines are selected.

In this manner, a sub-word line is selectively activated in the selected memory block 23 of the memory core 11 by selecting one of the main word lines MWL0 through MWLn and one of the sub-word decode lines SWD0 through SWD3.

The configuration of the word decoding mechanism shown in FIG. 3 and FIGS. 4A and 4B is referred to as a hierarchical word decoder scheme, which includes main word lines and sub word lines. In general, the word lines are formed from polysilicon. Since polysilicon has a high resistance as a wiring material, however, it causes a large signal delay. To avoid this, an aluminum line is laid out in parallel with a word line made of polysilicon, and the word line comes in contact with the aluminum line at predetermined intervals so as to lower the resistance of the word line. When an increase in integration density results in decreased line intervals, however, it becomes difficult to carry out the patterning of aluminum lines at the same pitch as that of polysilicon lines. The hierarchical word decoder scheme is employed to cope with this difficulty by dividing the word lines made of polysilicon into sub-word lines to reduce the signal delay to an acceptable level and by using aluminum lines as main word lines to avoid the delay.

In the following, embodiments of the present invention will be described by taking the hierarchical word decoder scheme as an example. It is apparent, however, that the present invention can be applied to a word decoder scheme having no hierarchical structure.

Figure 5:
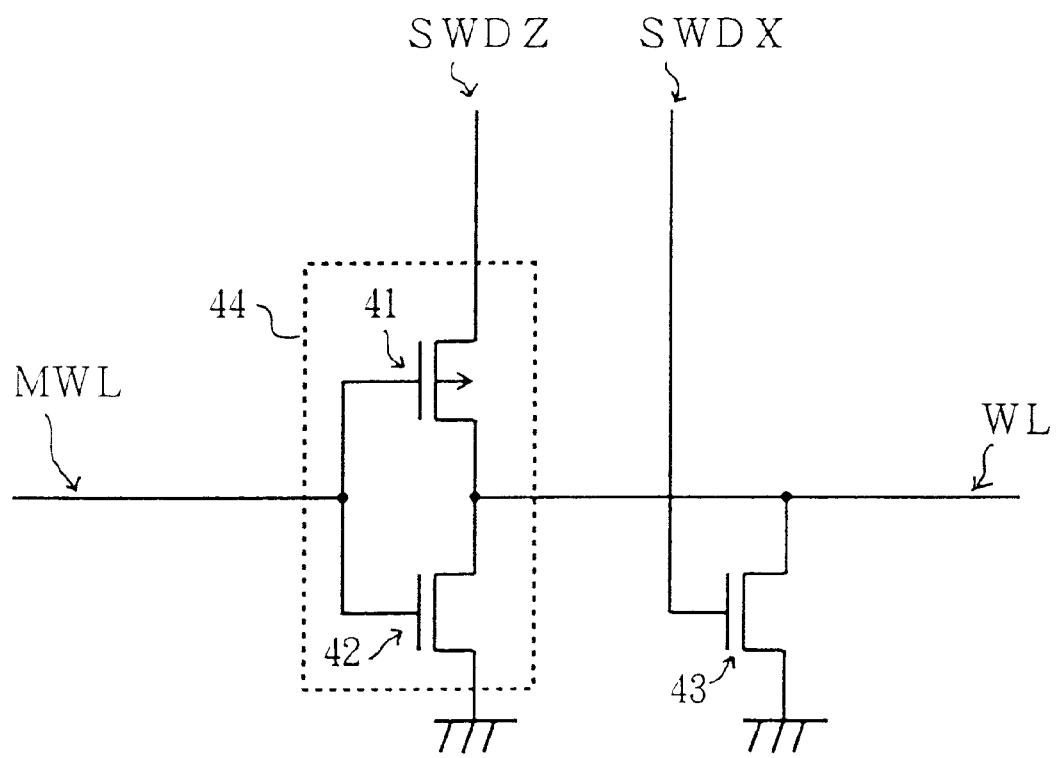
FIG. 5 is a circuit diagram of a sub-word decoder shown in FIG. 4B.

FIG. 5 is a circuit diagram of the sub-word decoder 31 (or 32) shown in FIG. 4B. The sub-word decoder 31 (or 32) of FIG. 5 includes a PMOS transistor 41 and NMOS transistors 42 and 43. The PMOS transistor 41 and the NMOS transistor 42 together form a word driver 44. In FIG. 5, a given one of the main word lines MWL0 through MWLn is shown as a main word line MWL. Also, a pair of sub-word decode lines SWDZ and SWDX is provided, and a corresponding sub-word line is shown as a sub-word line WL.

The main word line MWL is selected when it is turned into a low voltage level. In FIG. 5, the sub-word line WL is selected and turned into a high voltage level when the main word line MWL is selected, the sub-word decode line SWDZ is at the high voltage level, and the sub-word decode line SWDX is at the low voltage level. That is, with the main word line MWL and the sub-word decode line SWDX at the low voltage level, the PMOS transistor 41 is turned on, and the NMOS transistors 42 and 43 are turned off, thereby bringing the sub-word line WL to the same voltage level as that of the sub-word decode line SWDZ.

In FIG. 5, the NMOS transistor 43 is provided in order to keep the sub-word line WL at the low voltage level even when the main word line MWL is selected to be at the low voltage level, as long as the sub-word decoder 31 is not selected. Here, the sub-word decoder 31 is not selected when the sub-word decode line SWDZ is at the low voltage level and the sub-word decode line SWDX is at the high voltage level.

Figure 1:
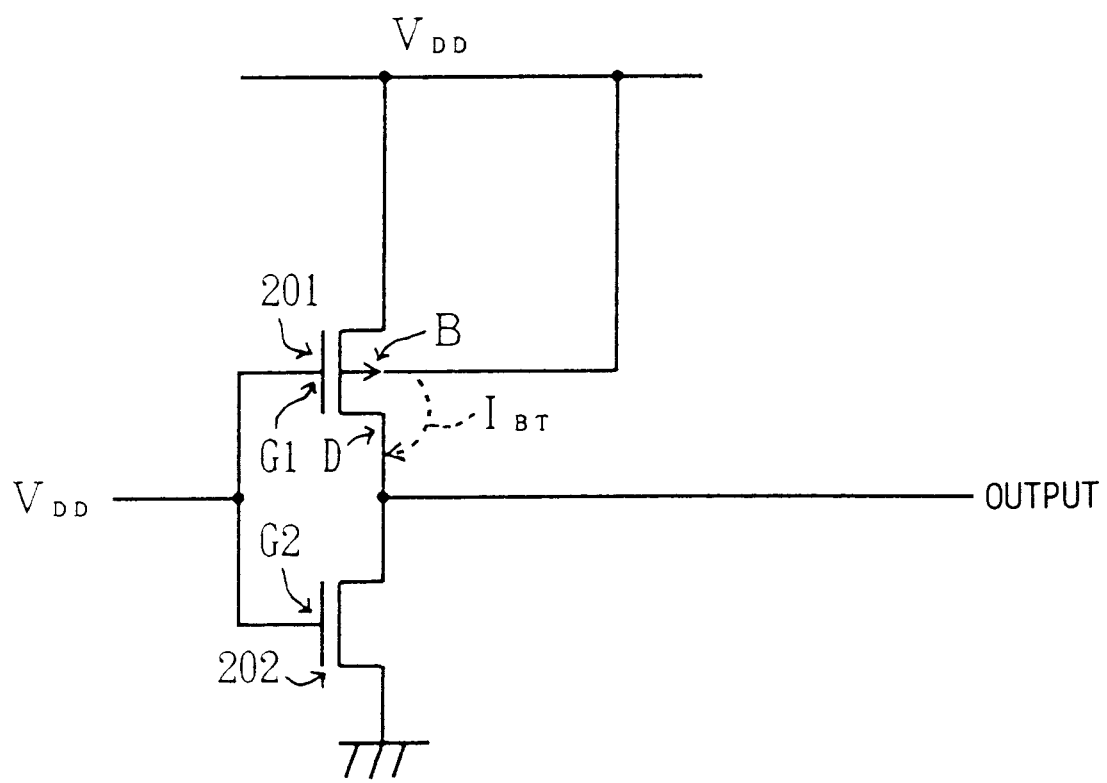
FIG. 1 is an illustrative drawing for explaining an effect of the inter-band tunnel current.

In the same manner as described in connection with the inverter circuit of FIG. 1, if an inter-band tunnel current appears when the PMOS transistor 41 of the word driver 44 is turned off in FIG. 5, the generated current ends up being wasted. In the present invention, a voltage level is controlled with respect to the main word line MWL which is used for selecting the word driver 44. In detail, the voltage level of the main word line MWL is lowered in the standby condition or when the pertinent memory block is not selected, thereby suppressing the inter-band tunnel current.

Figure 6:
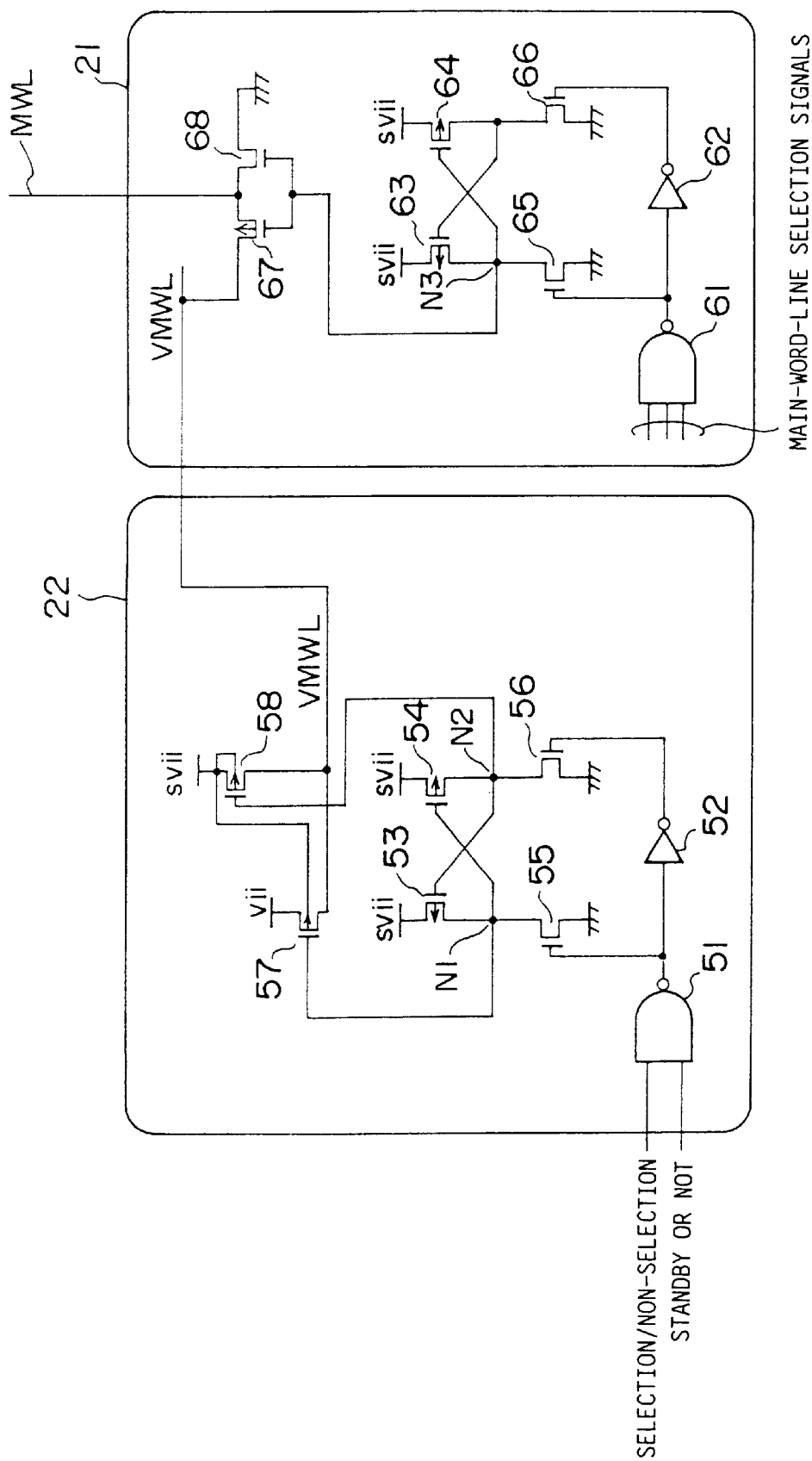
FIG. 6 is a circuit diagram of a main word decoder and a main-word-decoder driving circuit according to a first embodiment of the present invention.

FIG. 6 is a circuit diagram of the main word decoder 21 and the main-word-decoder driving circuit 22 according to a first embodiment of the present invention. The main word decoder 21 and the main-word-decoder driving circuit 22 shown in FIG. 6 operate such that the main word line MWL output from the main word decoder 21 has a reduced voltage level at the time of the standby condition or when a pertinent memory block is not selected. With such an operation, the inter-band tunnel current in the word driver 44 of FIG. 5 is suppressed. Namely, a gate voltage of the PMOS transistor 41 in the word driver 44 is reduced, so that the inter-band tunnel current flowing from the bulk to the source or the drain can be suppressed in the PMOS transistor 41.

In traditional word drivers, a selected main word line MWL is provided with a ground voltage vss, and all the other main word lines MWL receive a voltage svii which is higher than an internal operation voltage vii generally used in the DRAM 10. This voltage svii needs to be higher than the voltage vii because of the following reason. Since cell transistors of the memory cells are comprised of NMOS transistors, gates of the cell transistors need to receive a voltage equal to (vii+vth+α) when storing data of the high voltage level vii. Here, vth is a threshold voltage of the cell transistors, and α is a voltage required in excess to achieve a high-speed-data-write operation for the memory cells. Because of this, the sub-word line WL (see FIG. 5) should be provided with the voltage svii (=vii+vth+α) which is higher than the internal operation voltage vii generally used in the DRAM 10. To this end, the sub-word decode line SWDZ supplies the voltage svii to a selected word driver 44 in a selected memory block 23. In the selected memory block 23, however, there are unselected word drivers 44 which receive the voltage svii on the sub-word decode line SWDZ. In order to completely turn off the PMOS transistors 41 in the unselected word drivers 44 (see FIG. 5), the main word lines MWL need to be provided with the voltage svii. This is the reason why the unselected main word lines MWL need to be provided with the voltage svii in the traditional word drivers.

The present invention reduces the voltage svii supplied on the main word lines MWL to a lower voltage such as the voltage vii in the standby condition or in unselected memory blocks 23. In a selected memory block 23, unselected main word lines MWL receive the voltage svii while a selected main word line MWL receives the ground voltage vss. Here, the voltage of the main word lines MWL in the standby condition or in the unselected memory blocks 23 may be any appropriate voltage lower the voltage svii rather than the voltage svii.

The main-word-decoder driving circuit 22 of FIG. 6 includes a NAND circuit 51, an inverter 52, PMOS transistors 53 and 54, NMOS transistors 55 and 56, and PMOS transistors 57 and 58.

The NAND circuit 51 receives at one input a signal indicating whether the pertinent memory block 23 is selected, and receives at the other input a signal indicating whether the operation is in the standby condition. The signal indicating a selection/non-selection of the memory block 23 is provided from a pertinent other portion of the X decoder 13. The signal indicating whether the operation is in the standby condition may be the RAS signal supplied from the control buffer 15 of FIG. 2. The NAND circuit 51 outputs a low-level signal only when the operation is not in the standby condition and the pertinent memory block 23 is selected. In other words, the NAND circuit 51 outputs a high-level signal in the standby condition or when the pertinent memory block 23 is not selected.

When the pertinent memory block 23 is selected in a non-standby condition, the NMOS transistors 55 and 56 are turned off and on, respectively. A node N2 thus turns into a low level in a level shifter circuit which is formed by the PMOS transistors 53 and 54 and the NMOS transistors 55 and 56. As a result, the PMOS transistor 58 is turned on to supply the voltage svii to the main word decoder 21 as a main-word-decoder driving voltage VMWL.

When the pertinent memory block 23 is not selected or the operation is in the standby condition, the NMOS transistors 55 and 56 are turned on and off, respectively. A node N1 thus turns into a low level in the level shifter circuit which is formed by the PMOS transistors 53 and 54 and the NMOS transistors 55 and 56. As a result, the PMOS transistor 57 is turned on to supply the voltage vii to the main word decoder 21 as the main-word-decoder driving voltage VMWL.

The level shifter circuit mentioned above is provided in order to raise an output voltage level of the NAND circuit 51 and the inverter 52 to an operational voltage level of the PMOS transistors 57 and 58 because the output voltage level of the NAND circuit 51 and the inverter 52 is in accordance with the internal operation voltage vii of the DRAM.

The main word decoder 21 includes a NAND circuit 61, an inverter 62, PMOS transistors 63 and 64, NMOS transistors 65 and 66, a PMOS transistor 67, and a NMOS transistor 68.

The NAND circuit 61 receives main-word-line selection signals from a pertinent other portion of the X decoder 13. When a pertinent main word line MWL is selected, an output of the NAND circuit 61 becomes a low level. Otherwise, it maintains a high level.

When the pertinent main word line MWL is selected, the NMOS transistors 65 and 66 are turned off and on, respectively. A node N3 thus turns into a high level in a level shifter circuit comprised of the PMOS transistors 63 and 64 and the NMOS transistors 65 and 66. As a result, the PMOS transistor 67 and the NMOS transistor 68 are turned off and on, respectively, to supply the ground level (vss) to the main word line MWL.

When the pertinent main word line MWL is not selected, the NMOS transistors 65 and 66 are turned on and off, respectively. A node N3 thus turns into a low level in the level shifter circuit comprised of the PMOS transistors 63 and 64 and the NMOS transistors 65 and 66. As a result, the PMOS transistor 67 and the NMOS transistor 68 are turned on and off, respectively, to supply the main-word-decoder driving voltage VMWL to the main word line MWL.

As previously described, the main-word-decoder driving voltage VMWL is the voltage vii in the standby condition or when the pertinent memory block is unselected, and is the voltage svii when the pertinent memory block is selected.

As for the signal indicating the selection/non-selection of the memory block, the signal indicating either the standby condition or other conditions, and the main-word-line selection signals, they are within a scope of ordinary skill in the art, and a detailed description as to the generation of these signals will be omitted.

According to the first embodiment of the present invention as described above, the main-word-decoder driving circuit 22 and the main word decoder 21 operate such that the voltage level of the main word line MWL, which is the output of the main word decoder 21, is reduced from the voltage svii to the voltage vii in the standby condition or in the case of the pertinent memory block being unselected. In this manner, the inter-band tunnel current in the word driver 44 of FIG. 5 is suppressed.

Figure 7A:
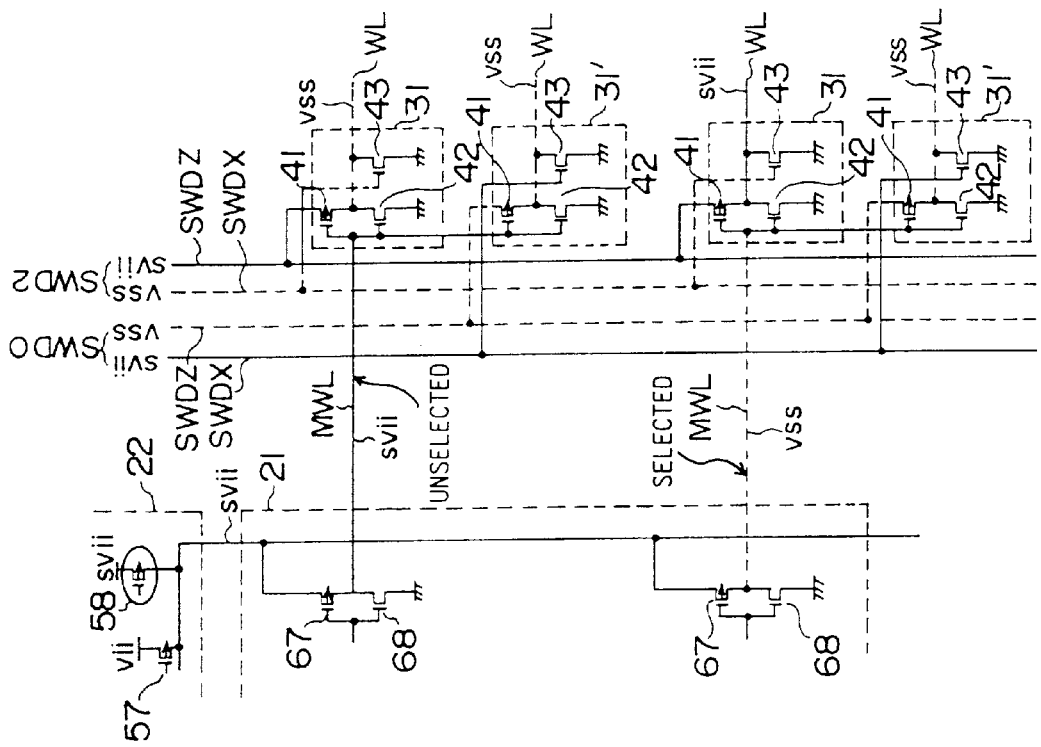
FIGS. 7A and 7B are circuit diagrams for explaining the voltage control of the main word lines according to the present invention.
Figure 7B:
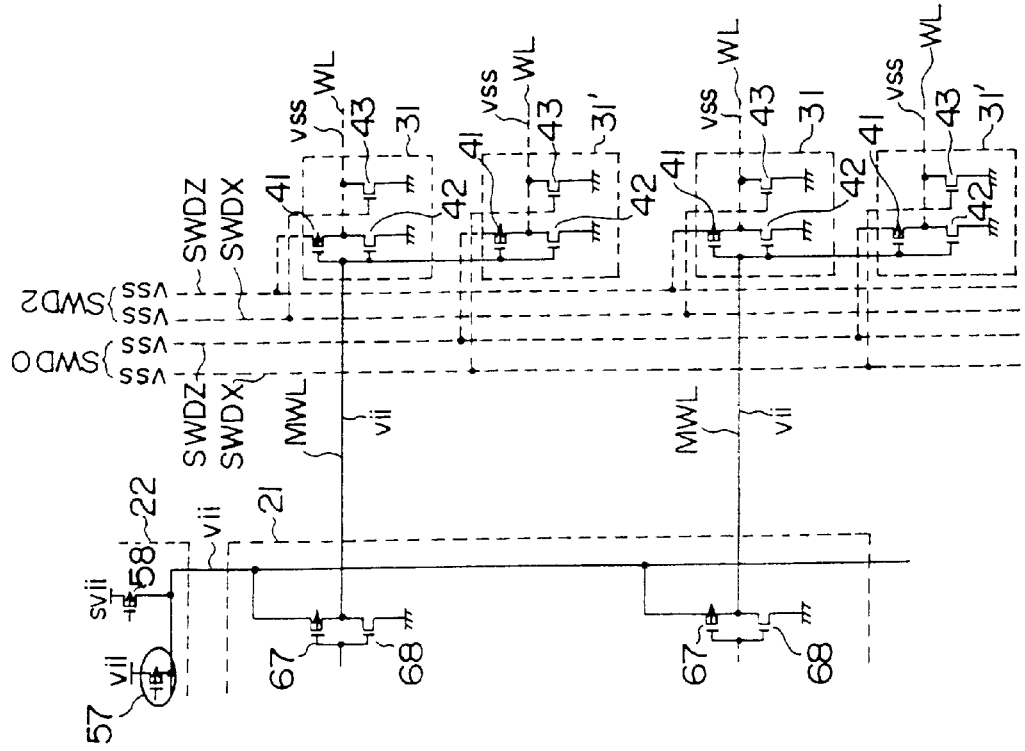

FIGS. 7A and 7B are circuit diagrams for explaining the voltage control of the main word line according to the present invention. In FIGS. 7A and 7B, the same elements as those of FIG. 5 and FIG. 6 are referred to by the same numerals. As previously described, the voltage control of the main word line MWL in the present invention can be classified into two cases. One is the case in which the operation is in the standby condition or the pertinent memory block 23 is not selected, and the other is the case in which the pertinent memory block 23 is selected.

FIG. 7A shows the case in which the operation is in the standby condition or the pertinent memory block 23 is not selected. According to the present invention, the voltage vii is supplied to the main word line MWL in this case. In FIG. 7A, the PMOS transistor 57 in the main-word-decoder driving circuit 22 is turned on, so that the voltage vii is supplied to the main word decoder 21. Since in this case the operation is in the standby condition or the pertinent memory block is unselected, the PMOS transistors 67 in the main word decoder 21 are turned on to supply the voltage vii from the main-word-decoder driving circuit 22 to the main word lines MWL.

Each of the main word lines MWL is connected to a pair of the sub-word decoders 31 and 31'. The sub-word decoder 31 receives sub-word decode lines SWD2 comprised of the sub-word decode line SWDZ and the sub-word decode line SWDX. The sub-word decoder 31' receives sub-word decode lines SWD0 comprised of the sub-word decode line SWDZ and the sub-word decode line SWDX. Since in this case the operation is in the standby condition or the pertinent memory block is unselected, the sub-word decode lines SWDZ and SWDX are provided with the ground voltage vss. With the voltage vii on each main word line MWL, the NMOS transistors 42 in the sub-word decoders 31 and 31' are turned on, so that the ground voltage vss appears on each of the sub-word lines WL.

Each of the main word lines MWL is set to the voltage vii which is lower than the conventional main-word-line voltage svii. Because of this, the PMOS transistors 41 in the sub-word decoders 31 and 31' have a gate voltage lower than a conventionally used gate voltage. This lower gate voltage reduces the inter-band tunnel current in the PMOS transistors 41 so as to effect a reduction in power consumption.

FIG. 7B shows the case in which the pertinent memory block 23 is selected. In this case, according to the present invention, a selected main word line MWL is provided with the voltage vss, and other main word lines MWL are set to the voltage svii. These are the same voltage assignments as these of the conventional technique. In FIG. 7B, the PMOS transistor 58 in the main-word-decoder driving circuit 22 is turned on to supply the voltage svii to the main word decoder 21. Since in this case the pertinent memory block is selected, the NMOS transistor 68 in the main word decoder 21 is turned on with respect to the selected main word line MWL, with the voltage vss supplied to the selected main word line MWL. With respect to an unselected main word line MWL, the PMOS transistor 67 is turned on so that the voltage svii from the main-word-decoder driving circuit 22 is supplied to the unselected main word line MWL.

Each of the main word lines MWL is connected to a pair of the sub-word decoders 31 and 31'. The sub-word decoder 31 receives the sub-word decode lines SWD2 comprised of the sub-word decode line SWDZ and the sub-word decode line SWDX. The sub-word decoder 31A receives the sub-word decode lines SWD0 comprised of the sub-word decode line SWDZ and the sub-word decode line SWDX. In FIG. 7B, in order to select the sub-word decoders 31, the sub-word decode lines SWDX and SWDZ of the sub-word decode lines SWD2 are set to the voltages vss and svii, respectively. In order to make the sub-word decoders 31' unselected, further, the sub-word decode lines SWDX and SWDZ of the sub-word decode lines SWD0 are set to the voltages svii and vss, respectively. In this manner, the sub-word decoders 31 and 31' are selected and unselected, respectively.

In the sub-word decoders 31 and 31' with respect to the unselected main word line MWL having the voltage svii, the NMOS transistors 42 are turned on to maintain the sub-word line WL at the ground voltage vss.

In the selected sub-word decoder 31 with respect to the selected main word line MWL having the voltage vss, the PMOS transistor 41 is turned on so that the voltage svii appears on the sub-word line WL. In the unselected sub-word decoder 31' with respect to the selected main word line MWL having the voltage vss, however, the NMOS transistor 43 is turned on so that the sub-word line WL has the ground voltage vss.

FIGS. 8A through 8C are timing charts showing the main-word-decoder driving voltage VMWL output from the main-word-decoder driving circuit 22 and the voltage of the main word line MWL output from the main word decoder 21. In FIG. 8A, /RAS (the symbol "/" indicates an inverse of the signal) represents the row-address-strobe signal, which is an address-input command given at the time of a data read/write operation.

At the start of the timing charts, /RAS is high so that the DRAM 10 is in the standby condition. In the standby condition, the main-word-decoder driving voltage VMWL and the voltage of the main word lines MWL are the voltage vii (FIGS. 8B and 8C). Therefore, the voltage vii is applied to the gate of the PMOS transistor 41 in the word driver 44 of FIG. 5, with the inter-band tunnel current being suppressed in this case.

At the time of the data-read/write operation, /RAS is turned into a low level.

In unselected memory blocks, the main-word-decoder driving voltage VMWL and the voltage of the main word lines MWL remain at the voltage vii (FIGS. 8B and 8C). Therefore, the voltage vii is applied to the gate of the PMOS transistor 41 in the word driver 44 of FIG. 5, with the inter-band tunnel current being suppressed.

Situations in selected memory blocks are as follows. The main-word-decoder driving voltage VMWL turns into the voltage svii (FIG. 8B). Unselected main word lines MWL have the voltage svii the same as the main-word-decoder driving voltage VMWL (FIG. 8C). Selected main word lines MWL have the ground voltage vss (FIG. 8C).

As described above, the present invention can reduce the inter-band tunnel current to decrease power consumption in the standby condition. Even when the memory is in operation, the inter-band tunnel current is reduced with respect to the unselected memory blocks so as to effect a reduction in power consumption.

Although the above description has been provided with reference to the particular embodiment, it is apparent that the present invention can be implemented in various configurations.

Figure 9:
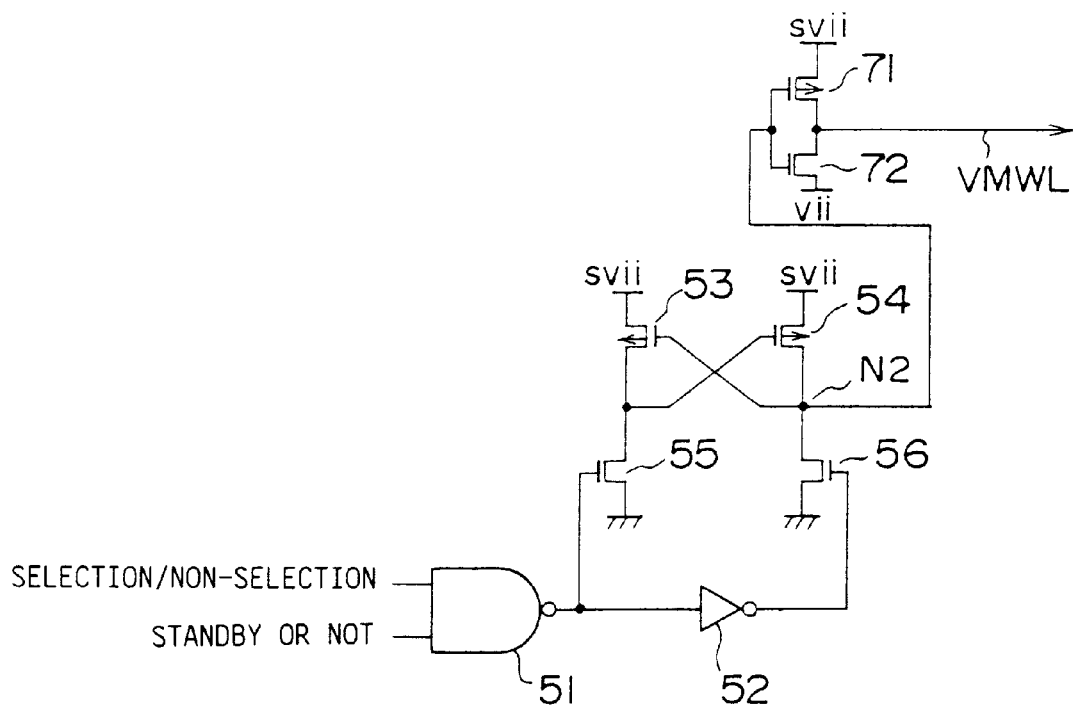
FIG. 9 is a circuit diagram of the main-word-decoder driving circuit according to a second embodiment of the present invention.

FIG. 9 is a circuit diagram of the main-word-decoder driving circuit according to a second embodiment of the present invention. In FIG. 9, the same elements as those of FIG. 6 are referred to by the same numerals, and a description thereof will be omitted.

In a main-word-decoder driving circuit 22A of FIG. 9, a PMOS transistor 71 and an NMOS transistor 72 are connected in series, and this circuit of the series connection is used in place of the PMOS transistors 57 and 58 of FIG. 6.

In the main-word-decoder driving circuit 22A, the node N2 is turned into a low level when the pertinent memory block is selected in a non-standby condition. As a result, the PMOS transistor 71 is turned on to output the voltage svii as the main-word-decoder driving voltage VMWL. The node N2 is turned into a high level in other cases. With the node N2 being the high level, the NMOS transistor 72 is turned on to provide the voltage vii as the main-word-decoder driving voltage VMWL.

In this manner, the main-word-decoder driving circuit 22A functions to provide the same main-word-decoder driving voltage VMWL as that of the first embodiment.

Further, the present invention is not limited to these embodiments, but various variations and modifications may be made without departing from the scope of the present invention.

What is claimed is:

1. A semiconductor memory comprising:
   a word driver for activating a word line coupled with memory cells, said word driver including a transistor having one end thereof connected to the word line; and
   a control unit for outputting a control voltage to a gate of the transistor, the control voltage being one of three different voltage levels which are a selection level, a first non-selection level, and a second non-selection level.

2. The semiconductor memory as claimed in claim 1, comprising a plurality of word drivers, said word driver being one of said plurality of word drivers, wherein said plurality of word drivers are grouped into a plurality of groups of said word drivers, and said control unit separately controls each of said groups of said word drivers.

3. The semiconductor memory as claimed in claim 2, further comprising a plurality of memory blocks including said memory cells, wherein said memory blocks correspond to said groups of said word drivers so that said control unit can separately control each of said memory blocks.

4. The semiconductor memory as claimed in claim 1, wherein said control unit reduces an inter-band tunnel current of the transistor when said semiconductor memory is in a standby condition.

5. The semiconductor memory as claimed in claim 3, wherein said control unit controls said memory blocks differently between selected memory blocks selected for data input/output and unselected memory blocks other than said selected memory blocks, and reduces said inter-band tunnel currents with respect to said unselected memory blocks.

6. The semiconductor memory as claimed in claim 1, wherein said first non-selection level being equal to a voltage appearing on the word line in an activated state, said second non-selection level being lower than said first non-selection level, and said selection level being a ground voltage.

7. The semiconductor memory as claimed in claim 6, wherein another end of the transistor receives one of said first non-selection level and said ground voltage as a power voltage.

8. The semiconductor memory as claimed in claim 5, wherein said first non-selection level being equal to a voltage appearing on the word line in an activated state, said second non-selection level being lower than said first non-selection level, and said selection level being a ground voltage.

9. The semiconductor memory as claimed in claim 8, wherein said control unit supplies said selection level to word drivers selected in said selected memory block, supplies said first non-selection level to word drivers unselected in said selected memory block, and supplies said second non-selection level to word drivers in said unselected memory block.

10. The semiconductor memory as claimed in claim 8, wherein said control unit supplies said second non-selection level to word drivers so as to reduce inter-band tunnel currents when said semiconductor memory is in a standby condition.

11. The semiconductor memory as claimed in claim 6, wherein said control unit comprises:
   a first transistor receiving said first non-selection level as a power voltage; and
   a second transistor receiving said second non-selection level as a power voltage,
   wherein complement signals are provided to gates of said first transistor and said second transistor to select one of said first non-selection level and said second non-selection level.

12. The semiconductor memory as claimed in claim 11, wherein said control unit further comprises a level shifter circuit for outputting said complement signals.

13. The semiconductor memory as claimed in claim 6, wherein said control unit comprises a P-type transistor and an N-type transistor connected in series between said first non-selection level and said second non-selection level, and a signal is commonly applied to gates of said P-type transistor and said N-type transistor to select one of said first non-selection level and said second non-selection level.

14. The semiconductor memory as claimed in claim 13, wherein said control unit further comprises a level shifter circuit for outputting said signal.

15. The semiconductor memory as claimed in claim 7, wherein the transistor is a PMOS transistor.

16. The semiconductor memory as claimed in claim 13, wherein the control voltage is the second non-selection level when the power voltage is the ground voltage.

17. The semiconductor memory as claimed in claim 6, wherein the second non-selection level is an internal power supply voltage.

* * * * *